(12) United States Patent
Dickey et al.

(10) Patent No.: US 6,240,588 B1
(45) Date of Patent: Jun. 5, 2001

(54) WAFER SCRUBBING BRUSH CORE

(75) Inventors: Tanlin Dickey, Sunnyvale; Julia S. Svirchevski, San Jose; Donald E. Anderson, Morgan Hill; Mike Ravkin, Sunnyvale; Helmuth W. Treichel, Milpitas; Roy Winston Pascal, Union City; Douglas S. Gardner, Milpitas, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/454,698

(22) Filed: Dec. 3, 1999

(51) Int. Cl.[7] ...................................................... B05C 1/08
(52) U.S. Cl. ............................................ 15/88.3; 15/102
(58) Field of Search ........................... 15/77, 88.2, 88.3, 15/102, 230.11, 179; 118/258, 259; 401/197; 492/16–18

(56) References Cited

U.S. PATENT DOCUMENTS

| | | |
|---|---|---|
| 2,563,048 | 8/1951 | Liebelt et al. . |
| 2,563,049 | 8/1951 | Liebelt et al. . |
| 2,565,743 | 8/1951 | Schaefer . |
| 2,606,334 | 8/1952 | Vaden et al. . |
| 2,889,696 | 6/1959 | Lynch . |
| 3,826,581 | 7/1974 | Henderson . |
| 4,461,052 | 7/1984 | Mostul . |
| 4,476,601 | 10/1984 | Oka . |
| 4,569,695 | 2/1986 | Yamashita et al. . |
| 5,081,733 | 1/1992 | Kudo . |
| 5,518,552 | 5/1996 | Tanoue et al. . |
| 5,639,311 | 6/1997 | Holley et al. . |
| 5,713,095 * | 2/1998 | Wakat ................................ 15/230.11 |
| 5,745,945 | 5/1998 | Manfredi et al. . |
| 5,806,126 | 9/1998 | de Larios et al. . |
| 5,875,507 | 3/1999 | Stephens et al. . |

FOREIGN PATENT DOCUMENTS

| | | |
|---|---|---|
| 448290 | 8/1927 | (DE) . |
| 674645 | 4/1939 | (DE) . |
| 1035235 | 4/1953 | (FR) . |
| 59-193029 | 11/1984 | (JP) . |
| 271795 | 11/1967 | (SD) . |

* cited by examiner

Primary Examiner—Terrence R. Till
(74) Attorney, Agent, or Firm—Martine Penilla & Kim, LLP

(57) ABSTRACT

A brush core and the method for making a brush core for use in substrate scrubbing are provided. The substrate can be any substrate that may need to undergo a scrubbing operation to complete a cleaning operation, etching operation, or other preparation. For instance, the substrate can be a semiconductor wafer, a disk, or any other type of work piece that will benefit from a brush core that can deliver uniform controlled amounts of fluid through the brush along an entire length of the brush core. The brush core is defined by a tubular core having a length that extends between a first end and a second end. The first end has an opening into a bore that is defined through a middle of the tubular core and extends along an inner length of the tubular core. A first plurality of holes are oriented along a plurality of first lines that extend in the direction of the length of the tubular core, and each of the first plurality of holes define paths to the bore of the tubular core. A second plurality of holes are oriented along a plurality of second lines that extend in the direction of the length of the tubular core, and each of the second plurality of holes define paths to the core of the tubular core. The plurality of first lines and the plurality of second lines alternate and the holes of the first and second plurality of holes are equally spaced apart. The holes of the second plurality of holes are offset relative to the holes of the first plurality of holes.

20 Claims, 7 Drawing Sheets

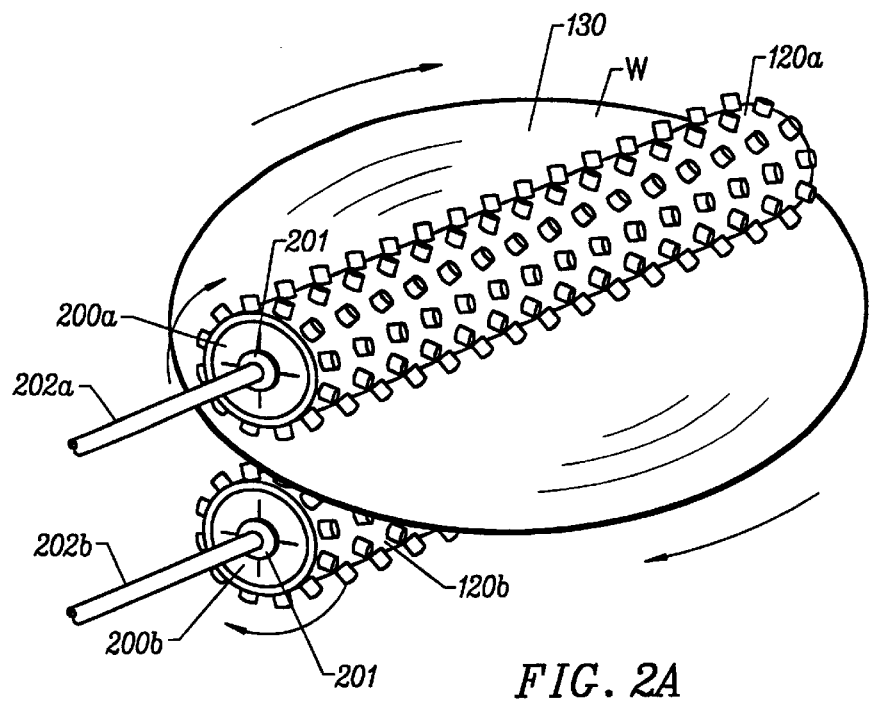
FIG. 2A
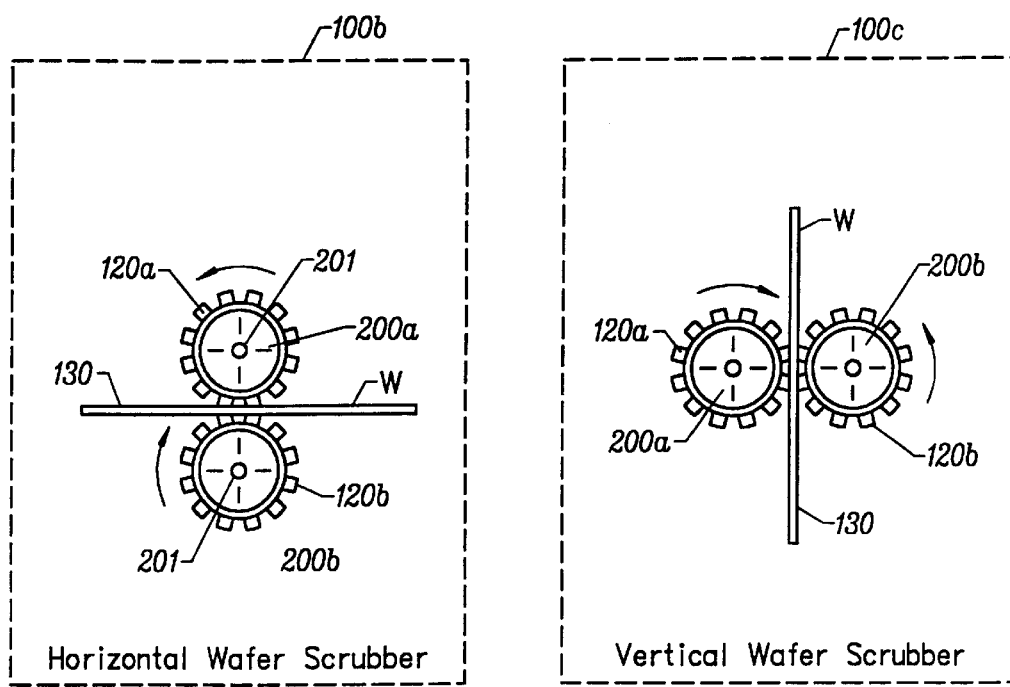
Horizontal Wafer Scrubber
FIG. 2B
Vertical Wafer Scrubber
FIG. 2C

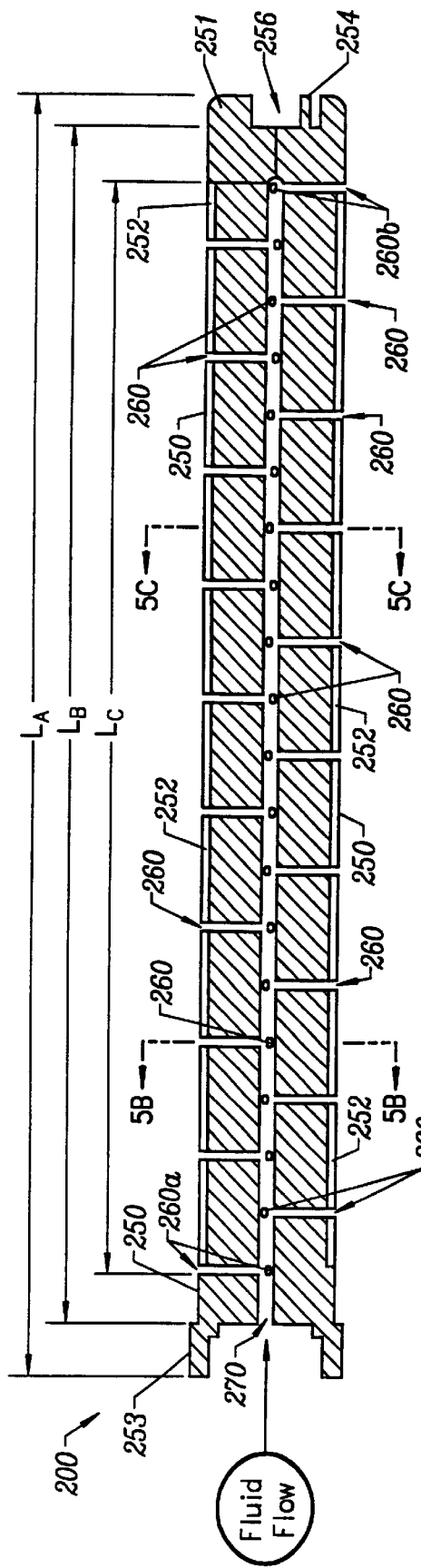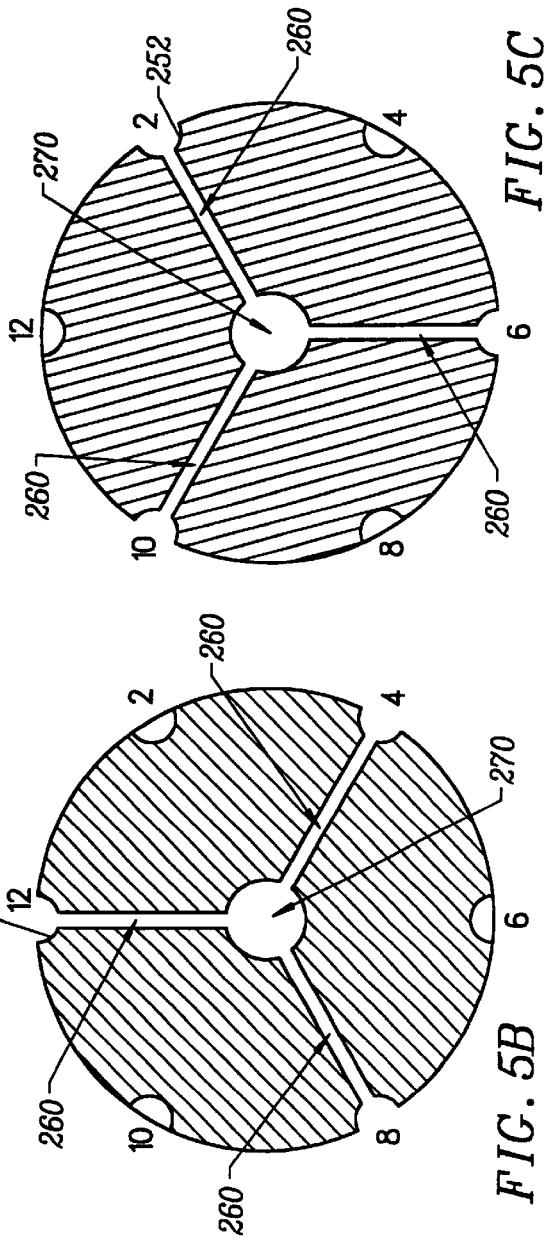
FIG. 5A
FIG. 5B
FIG. 5C

WAFER SCRUBBING BRUSH CORE

BACKGROUND OF THE INVENTION

1. Field of the Invention

This invention relates generally to semiconductor wafer fabrication, and more particularly to semiconductor wafer scrubbing equipment.

2. Description of the Related Art

As is well known, semiconductor devices are fabricated from semiconductor wafers, which are subjected to numerous processing operations. These operations include, for example, impurity implants, gate oxide generation, intermetal oxide depositions, metallization depositions, photolithography pattering, etching operations, chemical mechanical polishing (CMP), etc. Although these processes are performed in ultra clean environments, the very nature of many of the process operations is to blame for the generation of surface particles and residues. For instance, when CMP operations are performed, a film of particles and/or metal contaminants are commonly left behind.

Because surface particles can detrimentally impact the performance of an integrated circuit device, wafer cleaning operations have become a standard procedural requirement after certain process steps. Although cleaning operations are rather procedural, the equipment and chemicals implemented to perform the actual cleaning are highly specialized. This specialization is important because each wafer, being at different stages of fabrication, represents a significant investment in terms of raw materials, equipment fabrication time, and associated research and development.

To perform the cleaning operations in an automated manner, fabrication labs employ cleaning systems. The cleaning systems typically include one or more brush boxes in which wafers are scrubbed. Each brush box includes a pair of brushes, such that each brush scrubs a respective side of a wafer. To enhance the cleaning ability of such brush boxes, it is common practice to deliver cleaning fluids through the brush (TTB). TTB fluid delivery is accomplished by implementing brush cores that have a plurality of holes that allow fluids being fed into the brush core at a particular pressure to be released into an outer brush surface. The outer brush surface is made out of a very porous and soft material so that direct contact with the delicate surface of a wafer does not cause scratches or other damage. Typically, the outer brush surface is a made out of polyvinyl alcohol (PVA) foam. Although, other materials such as nylon, mohair or a mandrel wrapped with a polishing pad material can be used.

As semiconductor design and performance requirements continue increase, cleaning engineers are also challenged to improve their associated processes. To meet these demands, the same cleaning equipment is now being used to perform operations other than basic de-ionized (DI) water cleaning. Such operations include the application of sophisticated chemicals TTB to remove particulates and/or to etch precision amounts of materials from the surfaces of a wafer. Although much research and development goes into the design of cleaning and etching chemicals, the effectiveness of such chemicals is only as good as their delivery and application onto the surface of a wafer.

Recent research of conventional brush core technology has uncovered non-uniformities in the application of the chemicals onto the surface of wafers. The research indicates that although chemicals are being flushed out of the brush cores and onto the wafer surfaces, the applied chemicals do exit the holes of the brush core at the same rate over the length of a core. For instance, chemicals are generally supplied to an internal bore of a brush core from one end of the brush core at a given pressure. Ideally, the chemicals are expected to flow through the bore and drip or flow out of the core equally from all of the brush core holes (e.g., the same amount drips out each of holes all along the brush core). Unfortunately, research shows that chemicals are not dripping out of all of the holes at the same or substantially the same rate. In fact, much of the research indicates that the brush core holes near the chemical receiving end drip out chemicals at a substantially faster rate than holes at the opposite side of the chemical receiving end.

Because traditional cleaning typically only included the application of DI water and/or ammonia based chemicals, the uneven application of these fluids through the brush core did not in many cases detrimentally impact cleaning performance. However, because most cleaning systems are now required to also apply engineered chemicals, such as hydrofluoric acid (HF) containing etch chemicals, any uneven application will have a severe impact on the wafer being processed. For instance, if more HF is applied to one part of the wafer and less is applied to another part of the wafer, the surface of the processed wafer may exhibit performance impacting etch variations due to experienced chemical concentration variations.

FIG. 1A provides a simplified diagram 10 of a prior art brush core 12 having a plurality of holes 12a. The brush core 12 has a center bore 12b which is configured to receive fluids from a fluid input 16 at one end of the brush core 12. The brush core 12 is shown having a brush 14 mounted thereon to illustrate that fluid that enters the bore 12b exits the holes 12a soaks the brush 14 that is designed to contact a wafer. This simplistic diagram also illustrates fluid flow lines 18a and 18b, in which fluid lines 18a illustrate that more fluid tends to flow out of holes 12a near the fluid input than at the opposite end. It is believed that this occurs because chemicals are either not applied to the brush core 12 at a sufficient pressure or the holes 12 are too large and/or are improperly arranged and thus allow gravity to pull more fluid out of the brush core 12 near the fluid input 16 than at the opposite end.

Some of these prior art brush cores 12 have a center bore 12b that is about 0.36 inch in diameter or larger and holes 12a that are about 0.13 inch in diameter or larger. To compensate for the larger size of these dimensions and to attempt to prevent the uneven delivery of fluids, cleaning systems need to deliver fluids to the brush cores 12 at higher pressures. These higher pressures range between 30 to 35 PSI or higher. However, the application of higher pressures require the cleaning system to have access to facilities and associated equipment that can deliver the desired controlled pressures at all times. However, cleaning systems are installed in clean rooms around the world having different facilities which may or may not be able to deliver the recommended pressures. Additionally, the holes 12a of most prior art brush cores 12 are arranged such that one hole 12a' is directly opposite of another hole 12a'. This arrangement is also believed to contribute to the higher outflow of fluids near the fluid input 16 than at the opposite end.

In view of the foregoing, there is a need for improved brush core designs that enable controlled amounts of fluid to be evenly delivered and distributed over the surface areas of a brush core.

SUMMARY OF THE INVENTION

Broadly speaking, the present invention fills these needs by providing a brush core for use in scrubbing substrates.

The substrate can be any substrate that may need to undergo a scrubbing operation to complete a cleaning operation, etching operation, or other preparation. For instance, the substrate can be a semiconductor wafer, a disk, or any other type of work piece that will benefit from a brush core that can deliver uniform controlled amounts of fluid through the brush along an entire length of the brush core. It should be appreciated that the present invention can be implemented in numerous ways, including as a process, an apparatus, a system, a device, or a method. Several inventive embodiments of the present invention are described below.

In one embodiment, a brush core for use in substrate scrubbing is disclosed. The brush core is defined by a tubular core extending between a first end and a second end. A bore is defined through a middle of the tubular core. A first and second plurality of holes are provided. Each hole of the first and second plurality of holes is defined through the tubular core to define a path to the bore. The first plurality of holes is defined along a first line that extends between the first end and the second end and the second plurality of holes is defined along a second line that extends between the first end and the second end. The first line and the second line are repeated around the tubular core and the first line and the second line alternate around the tubular core, and the holes of the first plurality of holes are offset relative to the holes of the second plurality of holes.

In another embodiment, a brush core is disclosed. The brush core is defined by a tubular core having a length that extends between a first end and a second end. The first end has an opening into a bore that is defined through a middle of the tubular core and extends along an inner length of the tubular core. A first plurality of holes are oriented along a plurality of first lines that extend in the direction of the length of the tubular core, and each of the first plurality of holes define paths to the bore of the tubular core. A second plurality of holes are oriented along a plurality of second lines that extend in the direction of the length of the tubular core, and each of the second plurality of holes define paths to the core of the tubular core. The plurality of first lines and the plurality of second lines alternate and the holes of the first and second plurality of holes are equally spaced apart. The holes of the second plurality of holes are offset relative to the holes of the first plurality of holes.

In yet a further embodiment, a method of making a brush core is disclosed. The method includes providing a tubular core having a length that is configured to extend over a substrate. A bore is defined through a center of the tubular core. A first plurality of holes oriented along a plurality of first lines that extend in the direction of the length of the tubular core is defined. Each of the first plurality of holes is configured to establish paths to the bore of the tubular core. A second plurality of holes oriented along a plurality of second lines that extend in the direction of the length of the tubular core is defined. Each of the second plurality of holes is configured to establish paths to the core of the tubular core. The defined first plurality of holes are configured to be offset from the defined second plurality of holes.

Advantageously, the embodiments of the present invention provide brush cores for delivering a uniform fluid distribution throughout the core. The uniform fluid distribution is achieved by designing specially placed and sized holes into the brush core. The holes define paths to a specially designed center bore, which is configured and sized to quickly pressurize the bore such that the delivered fluid exits the plurality of holes at about the same rate. Achieving this substantial even outflow of fluid from the core along the entire length of the brush core ensures that the outer brush receives equal amounts of fluids during an application process. As can be appreciated, even outflow of fluids is especially important when the fluids are engineered chemicals, such as etchants, that are designed to remove certain material particles, films, or layers.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2A illustrates a simplified three-dimensional diagram of a pair of brushes scrubbing a top surface and a bottom surface of a wafer, in accordance with one embodiment of the present invention.

FIGS. 2B and 2C illustrate cross-sectional views of two different orientations for scrubbing a wafer, in accordance with one embodiment of the present invention.

FIG. 5A shows a cross-sectional view of the brush core, in accordance with one embodiment of the present invention.

FIGS. 5B and 5C illustrate cross-sectional views A—A and B—B along a brush core, in accordance with one embodiment of the present invention.

DETAILED DESCRIPTION OF THE PREFERRED EMBODIMENTS

An invention is described for a brush core for use in scrubbing substrates. The substrate can be any substrate that may need to undergo a scrubbing operation to complete a cleaning operation, etching operation, or other preparation. It will be obvious, however, to one skilled in the art, that the present invention may be practiced without some or all of these specific details. In other instances, well known process operations have not been described in detail in order not to unnecessarily obscure the present invention.

Figure 1A:
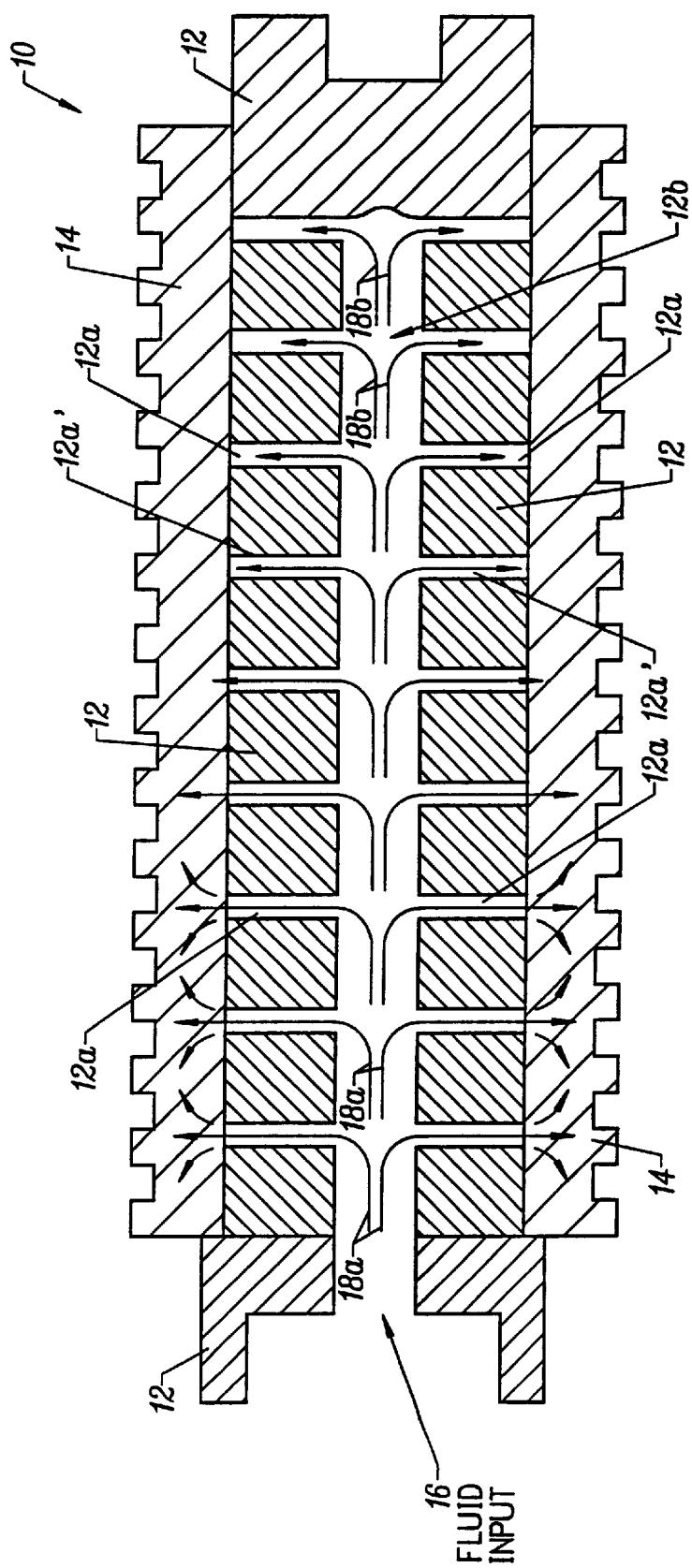
FIG. 1A provides a simplified diagram of a prior art brush core having a plurality of holes.
Figure 1B:
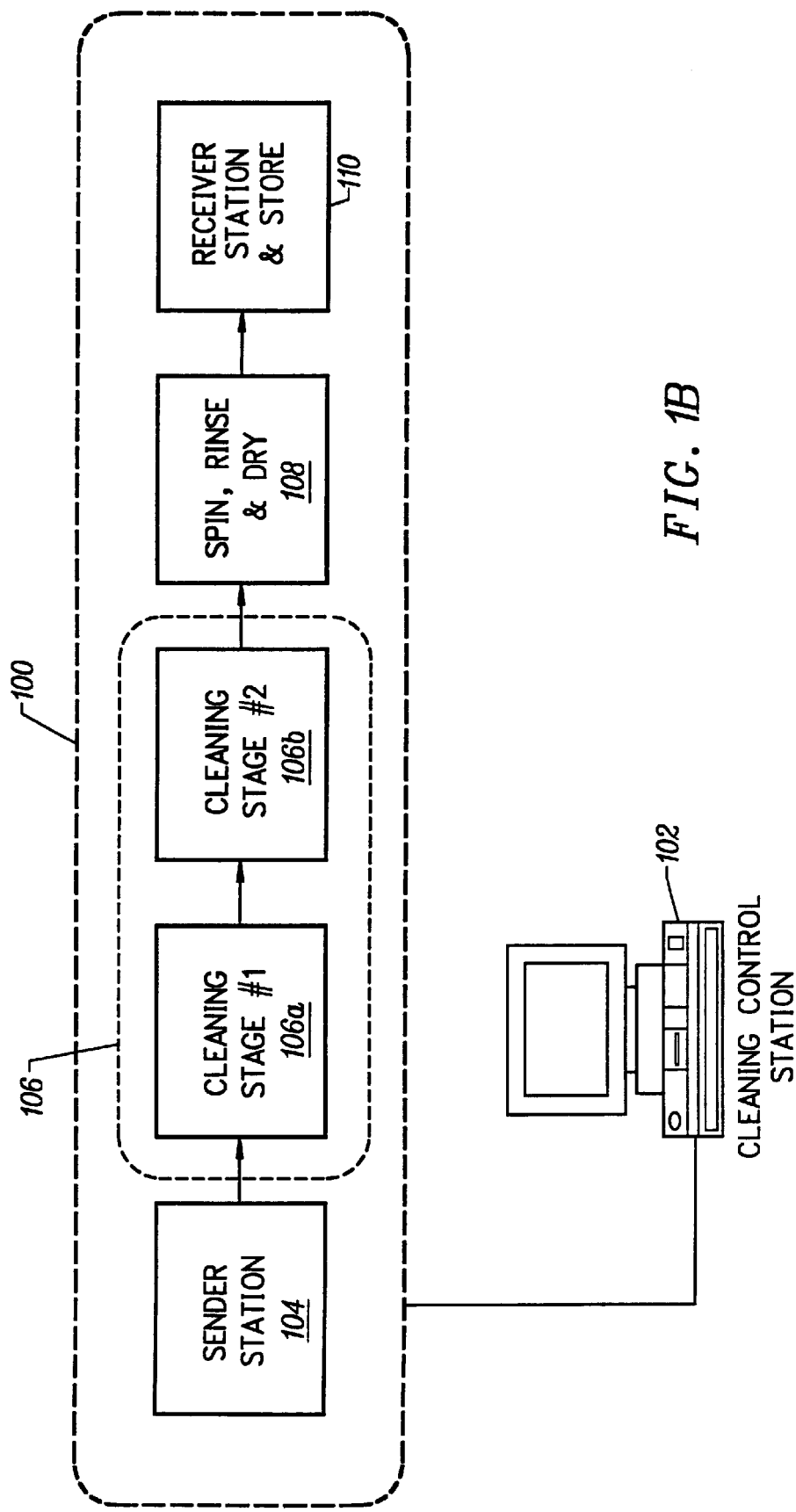
FIG. 1B shows a wafer cleaning station of the present invention that may be controlled in an automated way by a cleaning control station.

FIG. 1B shows a wafer cleaning station 100 of the present invention that may be controlled in an automated way by a cleaning control station 102. The wafer cleaning station 100 includes a sender station 104, a cleaning stage 106, a spin-rinse and dry (SRD) station 108, and a receiver station 110. As a broad overview of the cleaning process, semiconductor wafers are initially placed into the sender station 104. The sender station 104 then delivers a wafer (one-at-a-time)

to the cleaning stage 106. In one embodiment, the cleaning stage 106 is divided into a first cleaning stage 106a and a second cleaning stage 106b, although having just one cleaning stage 106 will also work. After passing through the cleaning stage 106, the wafer is passed through an exit spray in order to remove the cleaning fluids and any contaminants. The SRD station 108 dries the wafer and then it is delivered to the receiver station 110 for temporary storage.

Figure 1C:
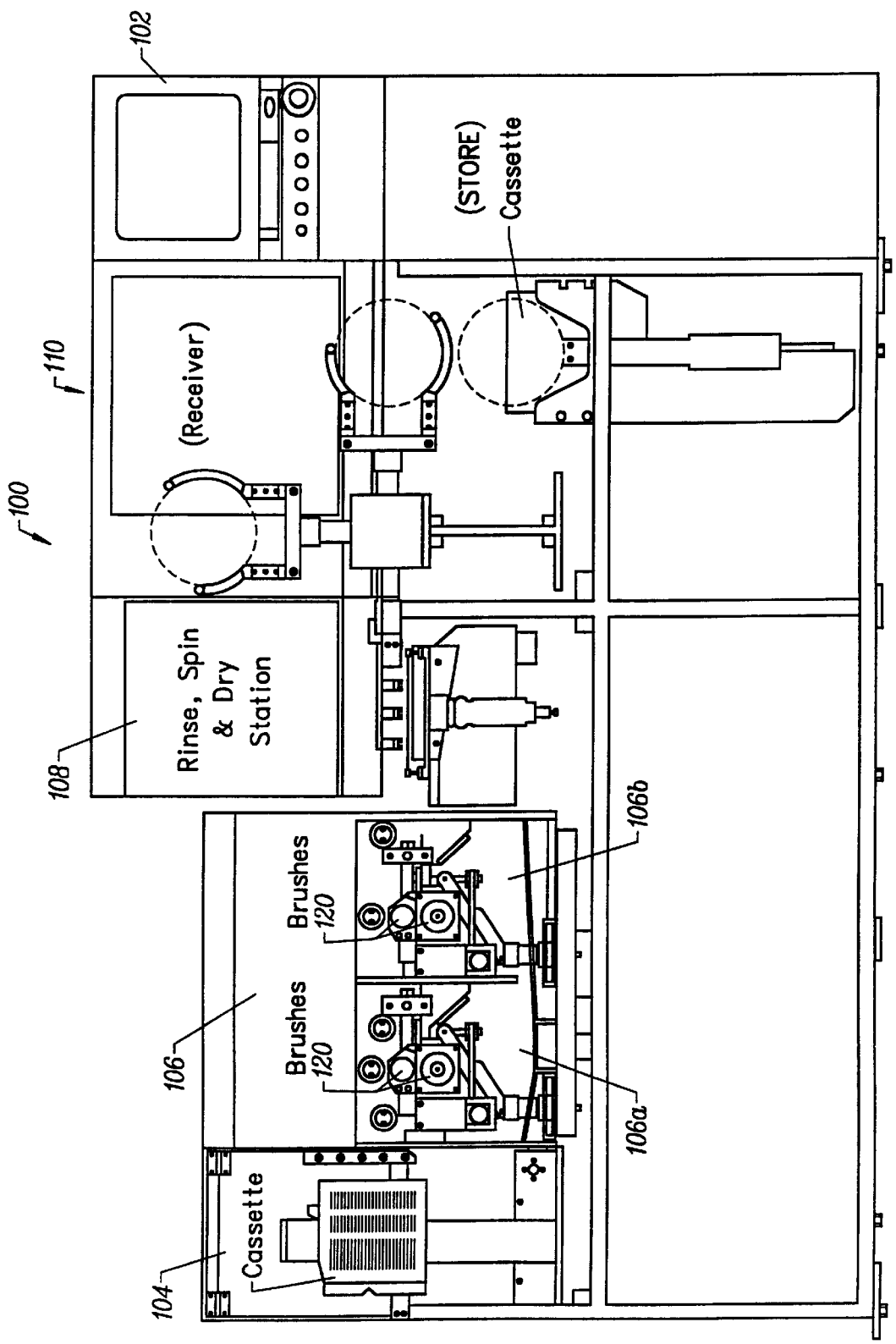
FIG. 1C shows a more detailed schematic of an exemplary wafer cleaning station, in accordance with one embodiment of the present invention.

FIG. 1C shows a more detailed schematic of an exemplary wafer cleaning station 100. Both the sender station 104 and the receiving station 110 are preferably adapted to receive a cassette containing a number of wafers. The first and second cleaning stages 106a and 106b preferably include a set of PVA brushes 120 that are very soft and porous. As will be described below, the brushes 120 are mounted on brush cores 200 of the present invention. As is well known, the brushes 120 are capable of scrubbing the wafer clean without damaging the delicate surface.

FIG. 2A illustrates a simplified three-dimensional diagram of a pair of brushes 120a and 120b for scrubbing a top surface and a bottom surface, respectively, of a wafer 130. Typically, the wafer 130 is caused to rotate in a particular direction while the brushes 120 rotate around an axis of rotation while the surface of the brushes 120 are in contact with the surfaces of the wafer 130. The brushes 120a and 120b are mounted on brush cores 200a and 200b. The brush cores 200 are configured to have at one end, a fluid inlet 201 which connects to tubing 202. The tubing 202 will thus supply the desired fluids to a bore 270 within the brush core 200. The brush core 200, as will be described in greater detail below, will have a plurality of holes 260 that will allow the fluids provided into the bore 270 to uniformly exit the brush core 200 (i.e., therefore evenly supplying the desired fluid to the brushes 120).

FIGS. 2B and 2C illustrate cross-sectional views of two different orientations for scrubbing a wafer 130, in accordance with one embodiment of the present invention. As shown in FIG. 2B, the wafer is held horizontally while a top brush 120a scrubs the top surface of the wafer 130, and a bottom brush 120b scrubs the bottom surface of the wafer 130. As mentioned above, the wafer 130 is configured to rotate (using rollers not shown) at the same time that the brushes 120 rotate to ensure that the entire surface area of the wafer is properly scrubbed to remove contaminants or etch the surface to a desired degree. Thus, FIG. 2B illustrates a horizontal wafer scrubber 100b.

In contrast, FIG. 2C illustrates a vertical wafer scrubber 100c in which the wafer 130 is scrubbed while in a vertical position. Typically, the wafer 130 sits on a pair of rollers of the scrubber 100c. The brushes 120 are configured to rotate in a desired direction such that both sides of the wafer 130 are evenly scrubbed, using an equal and opposite pressure on each side of the wafer 130. For more information on vertical wafer scrubbing, reference may be made to U.S. Pat. No. 5,875,507, having inventors Stephens et al., entitled "Wafer Cleaning Apparatus," which is hereby incorporated reference.

Figure 3:
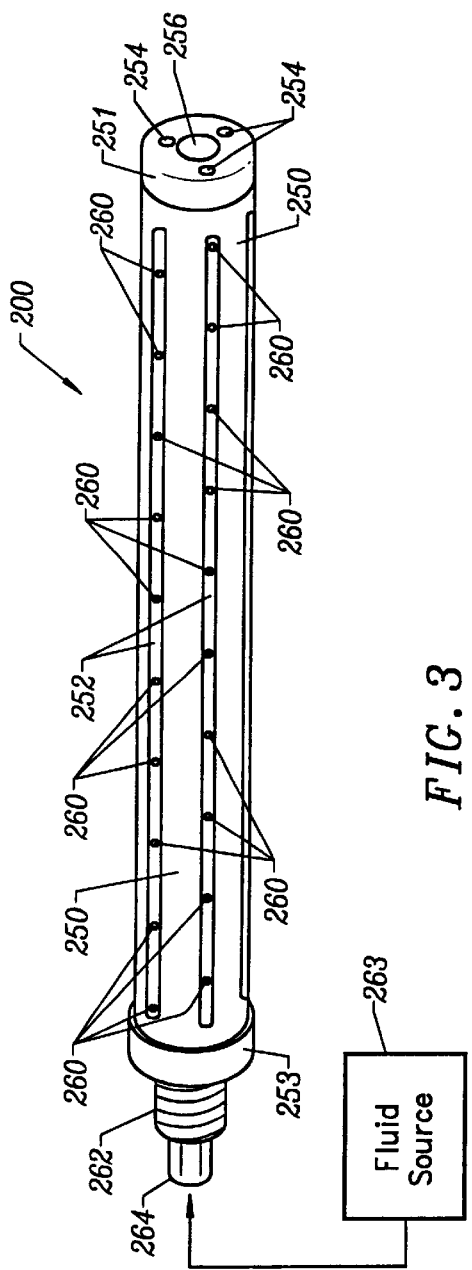
FIG. 3 illustrates a three-dimensional view of a brush core, in accordance with one embodiment of the present invention.

FIG. 3 illustrates a three-dimensional view of a brush core 200, in accordance with one embodiment of the present invention. The brush core 200 is defined by a tubular core 250 that extends between a first end 253 and a second end 251. The tubular core is configured to include, in one embodiment, a plurality of channels 252 which are recessed into the surface of the tubular core 250. One feature of the present invention is to ensure that an even distribution of fluid is provided throughout the brush core 200. For instance, a fluid source 263 supplies fluid by way of tubing (not shown) into the bore 270 of the tubular core 250 such that the fluid is evenly distributed to each of the plurality of holes 260. In a preferred orientation, the plurality of holes 260 of one channel 252 are arranged in an offset configuration relative to holes defined in an adjacent respective channel 252.

For instance, one channel may include a first plurality of holes 260 aligned along a first line across the length of the tubular core 250, and the next channel that is adjacent to the first channel will have its plurality of holes 260 defined along a second line across the length of the tubular core 250. However, the holes 260 defined in the adjacent channel 252 will be offset relative to the holes of its respective adjacent channel 252. In a preferred embodiment, the holes 260 will be evenly spaced apart and defined along the channel 252 that traverses the length of the tubular core 250. As shown, the holes 260 of the adjacent channel are shifted by an amount that is equal to about half of the separation distance between the holes of the first channel. In one embodiment, the offset can be any amount so long as some offset is provided. In this manner, any fluid provided by the fluid source 263 into the bore that is defined through the tubular core 250 will evenly distribute into the bore and emanate out from all of the plurality of holes defined through the tubular core 250.

In this example, the first end 253 of the brush core 200 includes a threaded insert 262 and an extension 264. This threaded insert 262 and extension 264 are configured to provide a way to connect up to an appropriate fluid line which will deliver fluids (e.g., chemicals, DI water, or mixtures of fluids) to the bore 270 of the tubular core 250. The second end 251 of the brush core 200 includes a connection hole 256 for holding the second end of the brush core 200 in place when it is installed into a suitable brush box mechanism. Also shown are a plurality of locking pin holes 254 for engaging the tubular core 250 and enabling the application of a torque rotation to the brush core when the brush box requires the brush core to rotate about a defined axis.

Figure 4B:
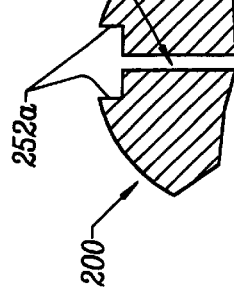
FIGS. 4A through 4C illustrate alternative channel geometries for a tubular core, in accordance with one embodiment of the present invention.
Figure 4A:
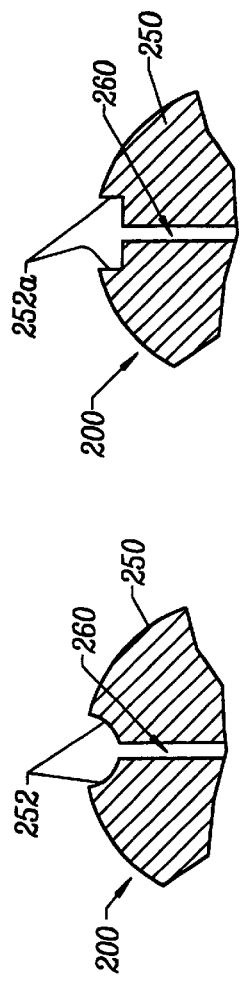
Figure 4C:
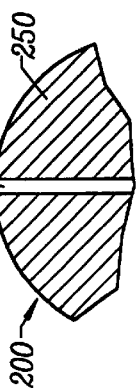

FIGS. 4A through 4C illustrate alternative channel geometries for the tubular core 250, in accordance with one embodiment of the present invention. As shown in FIG. 4A, a radial channel 252 can be defined into the tubular core 250 so that when the brush 120 is mounted on the brush core 200, any fluid provided through the plurality of holes 260 can be distributed along the channel and the length of the tubular core 250. FIG. 4B illustrates an alternative embodiment of the channel 252a in which a slotted channel is provided to achieve the distribution of the fluids along the length of the tubular core 250. In certain embodiments, it may be desired to eliminate the channel altogether as shown in FIG. 4C, and rely upon the very porous nature of the PVA brush which will absorb and evenly distribute the fluids throughout the brush. It should be understood that the actual shape or geometry of the channel can be varied or eliminated altogether if desired, for the particular application.

FIG. 5A shows a cross-sectional view of the brush core 200, in accordance with one embodiment of the present invention. As shown in this example, the brush core 200 will include a bore 270 which is defined along an inner length of the tubular core 250. The plurality of holes 260 illustrated along the top of the cross section are shown to be offset relative to the plurality of holes 260 defined along the bottom of the cross-sectional view. This offset design is configured to allow the even distribution of a fluid flow through the entire length of the bore 270, and thus allow an equal outflow of the fluid flow through each of the plurality of holes 260. That is, the present design is configured to allow a fluid flow having a reduced pressure to rapidly fill the bore 270 and reach equilibrium such that an equal flow of fluid will emanate from the plurality of holes 260 around the entire brush core 200. Thus, holes such as 260a defined near the first end 253 of the brush core 200 will exhibit about the same outflow of fluids as holes such as 260b defined at the second end 251 of the brush core 200.

FIGS. 5B and 5C illustrate cross-sectional views 5B—5B and 5C—5C along the brush core 200, in accordance with one embodiment of the present invention. In this example, FIG. 5B illustrates the cross-sectional view of cross section 5B—5B, and shows how the holes 260 are arranged around the tubular core 250. In this example, holes are defined around the tubular core 250 at 12 o'clock, 2 o'clock, 4 o'clock, 6 o'clock, 8 o'clock, and 10 o'clock. However, at cross section 5B—5B, only holes 260 at 12 o'clock, 4 o'clock, and 8 o'clock, are exposed to the fluid flow that travels down the bore 270.

Because of the offset nature of the plurality of holes 260 that are defined along lines of the tubular core 250, a cross-sectional view at 5C—5C shown in FIG. 5C, illustrates that the holes at 2 o'clock, 6 o'clock, and 10 o'clock are now exposed to the fluid flow. In a preferred embodiment, the bore 270 will have a diameter ranging between about 0.060 inch and about 0.35 inch, and more preferably, between about 0.125 inch and about 0.30 inch, and most preferably at about 0.25 inch. It should be noted that the diameter of the bore 270 is substantially smaller than that typically used or suggested for brush cores of the prior art. By reducing the diameter of the bore 270 to such a reduced diameter, it has been tested that the fluid flow that enters the bore 270 will rapidly fill the volume of the bore 270 within the brush core 250.

Because the volume within the bore 270 is rapidly filled, the bore 270 will be pressurized rapidly and the fluid will be ready to quickly outflow through the plurality of holes 260 all the way around the surface of the tubular core 250. In this preferred embodiment, each of the plurality of holes 260 should have a diameter ranging between about 0.005 inch and about 0.092 inch, and most preferably, about 0.050 inch. It should be noted that the diameter of each of the plurality of holes 260 is also substantially reduced, which is configured in conjunction with the reduced bore 270 diameter to distribute any fluid flow delivered to the brush core 200 in a more even and distributed manner throughout the entire length of the brush core 200. As discussed above, this is a substantial improvement in the art considering that the TTB fluid delivery is now being used to deliver sophisticated chemicals that are designed to alter the surface materials on a given substrate. For example, when chemistries including HF are applied to semiconductor wafer surfaces in an effort to etch certain material layers or films, an uneven application of such chemicals can cause surface damaging surface variations.

Continuing with the preferred design characteristics of a brush core 200, when the brush core 200 is designed for a 300 mm wafer scrubbing application, the brush core may have six channels 252 around the tubular core 250. Of course, more or less channels may be used (e.g., ranging between 2 and 12 channels). The total length $L_A$ of the exemplary brush core 200 is about 14 inches, and the brush 120 will thus have a length $L_B$ of about 13 inches. In this embodiment, the length $L_C$ of the channel 252 will be about 11 inches. Again, it should be understood that the length of the brush core 200 can vary and the number of holes within the channels 252 can also vary.

Figure 6:
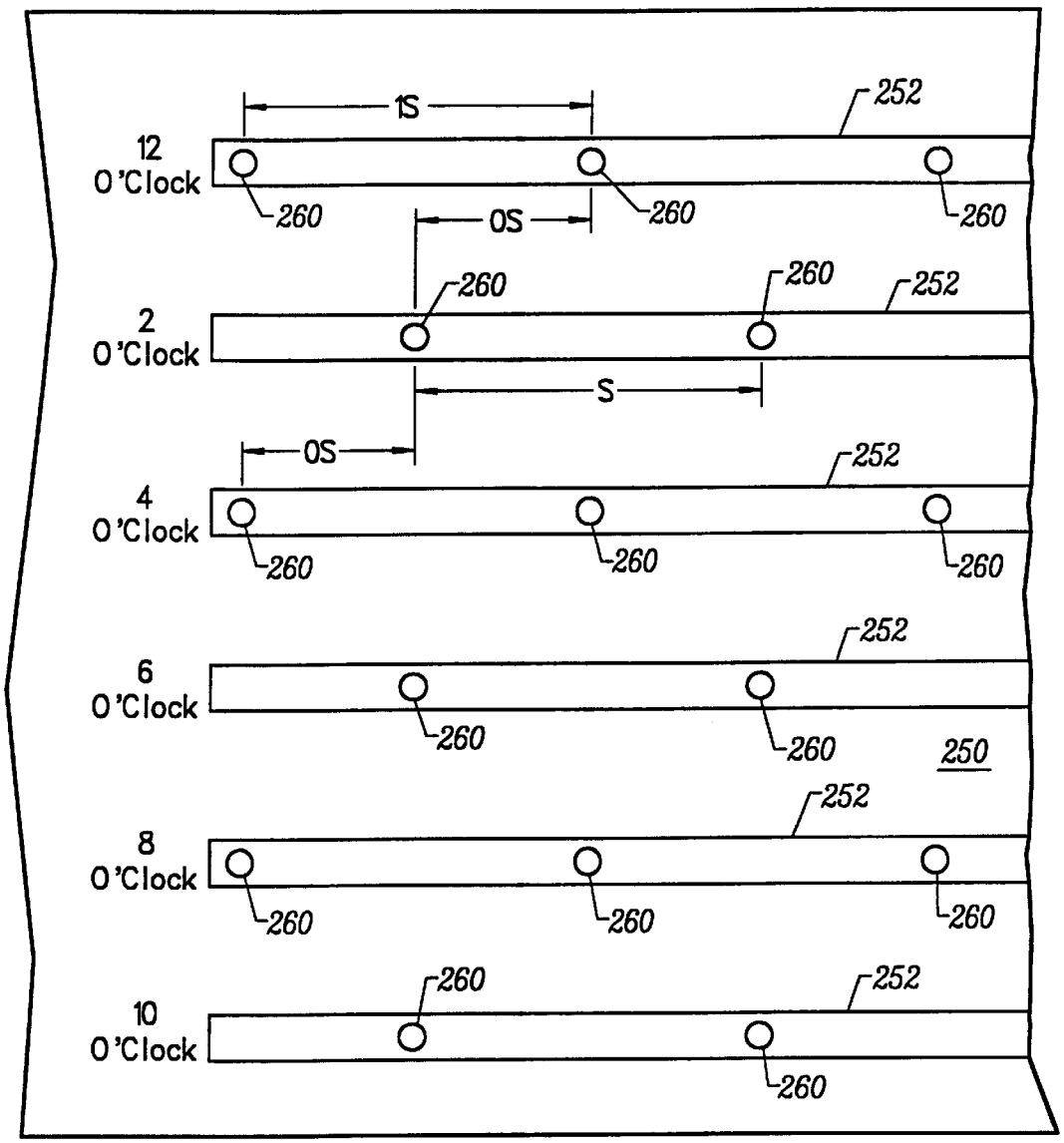
FIG. 6 illustrates a simplified diagram of a plurality of channels having a plurality of holes, in accordance with one embodiment of the present invention.

FIG. 6 illustrates a simplified diagram of a plurality of channels 252 having a plurality of holes 260, in accordance with one embodiment of the present invention. In the case where six channels are provided, a channel will be provided at 12 o'clock, 2 o'clock, 4 o'clock, 6 o'clock, 8 o'clock, and 10 o'clock. As shown, the orientation of the plurality of holes 260 along the channels for 12 o'clock, 4 o'clock, and 8 o'clock begin at the same location of their respective channel 252. Each of the plurality of holes 260 are separated by a separation distance S. In one embodiment, the separation distance is about 1.26 inch.

The separation distance S is selected such that an even spacing can be distributed along the distance of a selected channel. Thus, if the channel is longer or shorter, the separation S will be modified to meet the desired length of a given channel. In the exemplary embodiment of the present invention, the channel length is about 11 inches, and therefore the separation between each of the plurality of holes 260 is as described above about 1.26 inch. The holes in the adjacent channels 252 defined at 2 o'clock, 6 o'clock, and 10 o'clock, are offset relative to the holes of the first plurality of channels defined at 12 o'clock, 4 o'clock, and 8 o'clock.

This offset is preferably about half the distance of the separation parameter S. As pictorially illustrated, the offset between the channel of 12 o'clock and 2 o'clock is defined by an offset separation (OS) of about 0.63 inch. It should be understood that these parameters are only exemplary in nature and may be modified so long as some offset orientation is maintained to ensure even distribution of a fluid that may be provided into the bore 270.

It is again noted that the brush core of the present invention can be modified for use in scrubbing any number of substrate types, for example, semiconductor wafers, hard drive discs, flat panel displays, and the like. Additionally, the brush core can be modified for substrate scrubbing applications of any size, for example, 100 mm wafers, 200 mm wafers, 300 mm wafers, larger wafers, small hard disks, etc. It should also be noted that any number of fluids can be delivered through the brush (TTB), for example, DI water, ammonia containing chemical mixtures, HF containing chemical mixtures, surfactant containing chemical mixtures, and many other variations.

For more information on wafer scrubbing brush technology, reference can be made to U.S. Pat. No. 5,806,126, having inventors de Larios et al., entitled "Apparatus For A Brush Assembly," and U.S. patent application No. 09/112,666, having inventors Vail et al., entitled "Brush Interflow Distributor." This U.S. Patent and U.S. Patent Application are hereby incorporated by reference.

For additional information on wafer preparing systems and techniques, reference may be made to commonly owned U.S. patent application Nos. (1) 08/792,093, filed Jan. 31, 1997now U.S. Pat. No. 5,858,109, entitled "Method And Apparatus For Cleaning Of Semiconductor Substrates Using Standard Clean 1 (SC1)," (2) 08/542,531, filed Oct. 13, 1995 now U.S. Pat. No. 5,806,128, entitled "Method and Apparatus for Chemical Delivery Through the Brush," and (3) 09/277,712, filed Mar. 26, 1999, entitled "Pressure Fluctuation Dampening System." All three U.S. patent applications are hereby incorporated by reference.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A brush core for use in substrate scrubbing, comprising:
a tubular core extending between a first end and a second end;
a bore defined through a middle of the tubular core;
a first plurality of holes, each hole of the first plurality of holes being defined through the tubular core to define a path to the bore, the first plurality of holes being defined along a first line that extends between the first end and the second end; and
a second plurality of holes, each hole of the second plurality of holes being defined through the tubular core to define the path to the bore, the second plurality of holes being defined along a second line that extends between the first end and the second end, the first line and the second line are repeated around the tubular core and the first line and the second line alternate around the tubular core, and wherein the holes of the first plurality of holes are offset relative to the holes of the second plurality of holes, and each of the first lines and the second lines are defined along channels that are defined into an outer surface of the tubular core.

2. A brush core for use in substrate scrubbing as recited in claim 1, wherein a first hole of the first plurality of holes is defined at a start of the channel defined along the first line that extends between the first end and the second end, and a first hole of the second plurality of holes is defined at an offset from the start of the channel defined along the second line that extends between the first end and the second end.

3. A brush core for use in substrate scrubbing as recited in claim 2, wherein the first hole of the first plurality of holes is offset from the first hole of the second plurality of holes by about 0.36 inch, and each hole of the first and second plurality of holes is separated by about 1.26 inch.

4. A brush core for use in substrate scrubbing as recited in claim 3, further comprising:
a brush being configured to fit over the brush core.

5. A brush core for use in substrate scrubbing as recited in claim 1, wherein each of the first and second plurality of holes has a diameter ranging between about 0.005 inch and about 0.092 inch.

6. A brush core for use in substrate scrubbing as recited in claim 5, wherein the bore has a diameter ranging between about 0.060 inch and about 0.35 inch.

7. A brush core for use in substrate scrubbing as recited in claim 1, wherein the brush core is configured for a substrate in the range of 100 mm to 300 mm.

8. A brush core for use in substrate scrubbing as recited in claim 1, wherein the first plurality of holes are defined along three channels and the second plurality of holes are defined along three channels.

9. A brush core for use in substrate scrubbing as recited in claim 1, wherein the 2 to 12 channels are defined around the tubular core.

10. A brush core for use in substrate scrubbing as recited in claim 1, wherein a pressure ranging between about 1 PSI and 35 PSI is applied to the bore in order to distribute a fluid out of the first and second plurality of holes that extend between the first end and the second end.

11. A brush core, comprising:
a tubular core having a length that extends between a first end and a second end, the first end having an opening into a bore that is defined through a middle of the tubular core and extends along an inner length of the tubular core;
a first plurality of holes oriented along a plurality of first lines that extend in the direction of the length of the tubular core, each of the first plurality of holes defining paths to the bore of the tubular core;
a second plurality of holes oriented along a plurality of second lines that extend in the direction of the length of the tubular core, each of the second plurality of holes defining paths to the core of the tubular core;
the plurality of first lines and the plurality of second lines alternate, the holes of the first and second plurality of holes are equally spaced apart, and the holes of the second plurality of holes are offset relative to the holes of the first plurality of holes; and
a plurality of channels defined along the first and second plurality of lines, the plurality of channels defining recesses for distributing a fluid emanating from the bore and exiting the first and second plurality of holes.

12. A brush core as recited in claim 11, wherein each of the first and second plurality of holes has a diameter ranging between about 0.005 inch and about 0.092 inch.

13. A brush core, comprising:
a tubular core having a length that extends between a first end and a second end, the first end having an opening into a bore that is defined through a middle of the tubular core and extends along an inner length of the tubular core;
a first plurality of holes oriented along a plurality of first lines that extend in the direction of the length of the tubular core, each of the first plurality of holes defining paths to the bore of the tubular core;
a second plurality of holes oriented along a plurality of second lines that extend in the direction of the length of the tubular core, each of the second plurality of holes defining paths to the core of the tubular core;
the plurality of first lines and the plurality of second lines alternate, the holes of the first and second plurality of holes are equally spaced apart, and the holes of the second plurality of holes are offset relative to the holes of the first plurality of holes; and
wherein the bore has a diameter ranging between about 0.060 inch and about 0.35 inch.

14. A brush core as recited in claim 13, wherein the brush core is configured for a substrate in the range of 100 mm to 300 mm.

15. A brush core as recited in claim 13, wherein a spacing that defines the equally spaced apart orientation of the first and second plurality of holes is about 1.26 inch for a 300 mm brush core, and the offset is about 0.36 inch.

16. A method of making a brush core, comprising:
providing a tubular core having a length that is configured to extend over a substrate;
defining a bore through a center of the tubular core;
defining a first plurality of holes oriented along a plurality of first lines that extend in the direction of the length of the tubular core, each of the first plurality of holes establishing paths to the bore of the tubular core;
defining a second plurality of holes oriented along a plurality of second lines that extend in the direction of the length of the tubular core, each of the second plurality of holes establishing paths to the core of the tubular core; and
forming a plurality of channels along the first and second plurality of lines, the plurality of channels defining recesses for distributing a fluid that is configured to emanate from the bore and exit the first and second plurality of holes;
wherein the defined first plurality of holes are offset from the defined second plurality of holes.

17. A method of making a brush core as recited in claim 16, wherein each of the first and second plurality of holes has a diameter ranging between about 0.005 inch and about 0.092 inch.

18. A method of making a brush core as recited in claim 17, wherein the bore has a diameter ranging between about 0.060 inch and about 0.35 inch.

19. A method of making a brush core as recited in claim 18, further comprising:
delivering a fluid flow into the bore that is defined through the center of the tubular core, the delivered fluid flow having a pressure ranging between about 1 PSI and 15 PSI.

20. A method of making a brush core as recited in claim 19, wherein the fluid flow pressure is about 10 PSI.

* * * * *